United States Patent
Chang et al.

(10) Patent No.: US 9,608,606 B2
(45) Date of Patent: Mar. 28, 2017

(54) SLOPE CONTROL CIRCUIT

(71) Applicant: AMAZING MICROELECTRONIC CORP., New Taipei (TW)

(72) Inventors: Long-Xi Chang, Hsinchu County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 14/955,613

(22) Filed: Dec. 1, 2015

(65) Prior Publication Data
US 2017/0063354 A1    Mar. 2, 2017

(30) Foreign Application Priority Data

Aug. 27, 2015    (TW) .............................. 104128099 A

(51) Int. Cl.
*H03K 5/01*         (2006.01)
*H03K 3/353*        (2006.01)

(52) U.S. Cl.
CPC ............... *H03K 5/01* (2013.01); *H03K 3/353* (2013.01)

(58) Field of Classification Search
CPC ............. H03K 19/00; H03K 19/00315; H03K 19/00361; H03K 19/00384; H03K 3/00; H03K 3/353; H03K 5/00; H03K 5/01; H04L 25/00; H04L 25/0272; H04L 25/028

USPC .......................................................... 327/108
See application file for complete search history.

(56) References Cited

U.S. PATENT DOCUMENTS

| | | | |
|---|---|---|---|
| 4,379,260 | A | 4/1983 | Labus |
| 5,187,680 | A | 2/1993 | Engeler |
| 6,642,761 | B1 | 11/2003 | Tien |
| 8,841,894 | B1 | 9/2014 | Naraghi et al. |

FOREIGN PATENT DOCUMENTS

| | | |
|---|---|---|
| CN | 101212184 B | 6/2010 |
| TW | I399022 B1 | 5/2010 |
| TW | I351161 | 10/2011 |
| TW | I479790 B | 4/2015 |

*Primary Examiner* — Lincoln Donovan
*Assistant Examiner* — David Mattison
(74) *Attorney, Agent, or Firm* — Rosenberg, Klein & Lee

(57) ABSTRACT

A slope control circuit is connected between a replica circuit and a controller area network bus. The replica circuit generates an upper and a lower feedback signal. The slope control circuit receives and is driven by the feedback signals for controlling a voltage slope of a high-level output and a low-level output. The slope control circuit comprises an upper and a lower driving circuit, individually connected between the replica circuit, the high-level output and the low-level output. The upper driving circuit and the lower driving circuit respectively include at least one charging and discharging circuit. By controlling the charging and discharging circuit, the present invention controls decreasing voltage slope of the high-level output to be symmetric to increasing voltage slope of the low-level output, and delay time of the circuit switching between different operating modes to be equivalent.

19 Claims, 21 Drawing Sheets

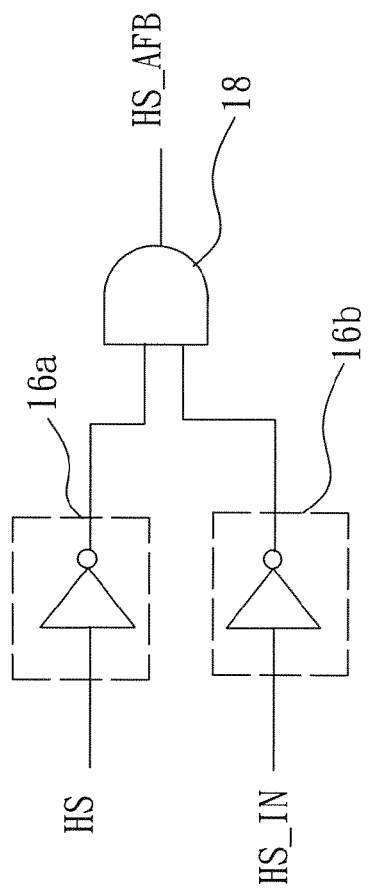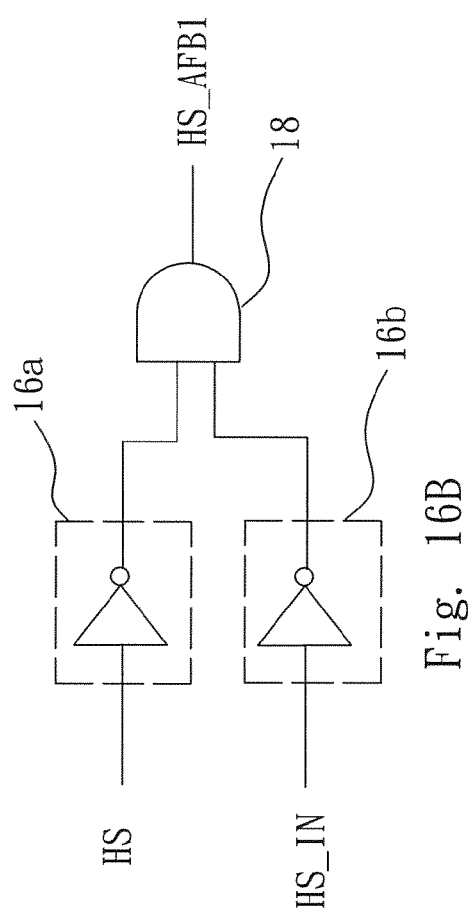

SLOPE CONTROL CIRCUIT

This application claims priority for Taiwan patent application no. 104128099 filed on Aug. 27, 2015, the content of which is incorporated by reference in its entirely.

BACKGROUND OF THE INVENTION

Field of the Invention

The present invention is related to a control circuit, and more particularly to a control circuit which can be widely utilized to control the slope of output voltage levels of various controller-area-network bus application systems and the like.

Description of the Prior Art

As known, controller area network (CAN) is a kind of specification established in early 1990's, got standardized as ISO 11898-1 in 1993, and widely used in all kinds of vehicles and electronic devices later on. In general, controller area network includes a serial bus, which provides high security level and efficient real-time control. Also, it is able to ensure debugging and priority determining mechanism, thereby making transmissions for internet messages much more reliable and efficient than ever. From this point of view, it is believed that the controller area network nowadays not only has highly flexible adjustment ability which can accommodate more station numbers in existed internet without modifying its software and/or hardware, but also enhances network upgrading conveniences since its data transmission path need not build upon certain specific standard stations.

Please refer to FIG. 1, which is a schematic drawing of a conventional controller area network bus, wherein two stations, i.e. a station 101 and a station 103 are disposed in the controller area network and are individually connected to a common bus 300 through each of the can-transceivers 200. A high-level output CANH and a low-level output CANL are utilized to provide a differential signal so as to achieve transmitting signals. In the digital logic design nowadays, for example as shown in FIG. 2, when the high-level output CANH and the low-level output CANL are both 2.5V, then the digital signal output will be "1". On the other hand, when the high-level output CANH is raised to 3.5V and the low-level output CANL is lowered to 1.5V, then the digital signal output will become "0". Speaking of maintaining a dynamic balance of the circuit, an U.S. Pat. No. 7,183,793 has disclosed a certain circuit diagram in which a current source is used for providing biasing voltages in one end of the circuit while operational transconductance amplifiers (OTA) are used for producing loop control currents in the other end when controlling its transistors therein to operate under a saturation region. As such, the electrical currents flowing in two different paths will become equivalent. Meanwhile, by controlling the slopes of amplifying current and reduction current of the current source, the conventional art thereby achieves symmetrical control of its high-level output and low-level output and performs slope control ability of the circuit.

However, it shall be noticed that in order to achieve the slope control ability, a great number of electronic components must be used no matter from the systematic design or IC chip design point of view. In addition, the circuit complexity would be accordingly increased as well. Also, most of the prior arts nowadays can only provide solutions based on different connection methods of the components disposed in the logic circuit. Under such circumstances, to design such a perfect circuit would become a difficult job to do, and the production cost for the circuit and numbers of components must be dramatically raised too, which induces severe budget issues.

On account of all, it should be apparent and obvious that there is indeed an urgent need for the professionals in the field for a novel slope control circuit to be developed so as to solve the above-mentioned problems occurring in the prior design.

SUMMARY OF THE INVENTION

In order to overcome the above-mentioned disadvantages, one major objective in accordance with the present invention is provided for a novel and creative slope control circuit which can successfully solves the problems of prior arts and achieve precise control ability for output DC voltage level.

Another objective in accordance with the present invention is provided for a novel slope control circuit, in which the RC effects caused due to at least one first and second charging and discharging circuit contribute to control a charging and/or discharging state of the circuit such that the voltage slopes of the output voltage level can be well controlled. Moreover, when achieving an excellent balance of the dynamic voltage slopes, the glitch peak values of the output voltage level can thus be effectively reduced as well.

And yet another objective in accordance with the present invention is provided for a novel slope control circuit, in which the circuit is able to be not only applied to controller area network buses, but also further connected to at least one self-feedback control circuit so as to control the delay time of the circuit switching between different operating modes to be equivalent, thereby being advantageous for being widely utilized in various control industrial systems and so on.

For achieving the above mentioned objectives, the present invention provides a slope control circuit which is electrically connected between a replica circuit and a controller area network bus, wherein the replica circuit generates an upper feedback signal and a lower feedback signal, and the slope control circuit receives and is driven by the upper feedback signal and the lower feedback signal so as to control a voltage slope of a high-level output and a low-level output of the controller area network bus.

According to one embodiment of the present invention, the slope control circuit comprises an upper driving circuit, connected between the replica circuit and the high-level output and comprising at least one first charging and discharging circuit, in which the first charging and discharging circuit is controlled in association with a decreasing voltage slope of the high-level output; and a lower driving circuit, connected between the replica circuit and the low-level output and comprising at least one second charging and discharging circuit, in which the second charging and discharging circuit is controlled in association with a increasing voltage slope of the low-level output such that the decreasing voltage slope of the high-level output and the increasing voltage slope of the low-level output are symmetric.

In another aspect, the first charging and discharging circuit of the present invention can be further connected to at least one first self-feedback control circuit, and the first self-feedback control circuit comprises a first secondary control switch and a first detection circuit connect to the first secondary control switch. Similarly, the second charging and discharging circuit of the present invention can also be further connected to at least one second self-feedback control circuit, and the second self-feedback control circuit comprises a second secondary control switch and a second detection circuit connect to the second secondary control switch. As such, the first detection circuit and the second detection circuit generate a first feedback signal and a second feedback signal respectively. By controlling and transmitting these feedback signals to each of the first and second charging and discharging circuit, the present invention achieves in maintaining the delay time of the main circuit when switching between different modes to be equivalent.

Furthermore, regarding the replica circuit of the present invention, it can be designed to be a double-feedback-path structure, comprising an upper feedback path and a lower feedback path. According to one embodiment of the present invention, the upper feedback path and the lower feedback path are connected jointly to a common mode and respectively generate the upper feedback signal and the lower feedback signal as previously said for transmitting to the upper driving circuit and the lower driving circuit so as to additionally control a DC output voltage stability of the high-level output and the low-level output.

Therefore, based on the above, the present invention is well designed and indeed discloses a novel slope control circuit, which is able to control a voltage drop between a high-level and low-level output voltage around 2V and its glitch peak value under 400 mV as well. Also, the voltage slopes of the high-level output and the low-level output are successfully controlled to be symmetric. Thus, it is believed that the present invention is advantageous of having excellent control stability over output voltage signals as well as maintaining precise slope control ability to the DC output levels when compared to the prior arts.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 16A shows a detailed drawing of the first detection circuit according to FIG. 8.

FIG. 16B shows a detailed drawing of the first detection circuit according to FIG. 9.

DESCRIPTION OF THE PREFERRED EMBODIMENTS

Figure 1:
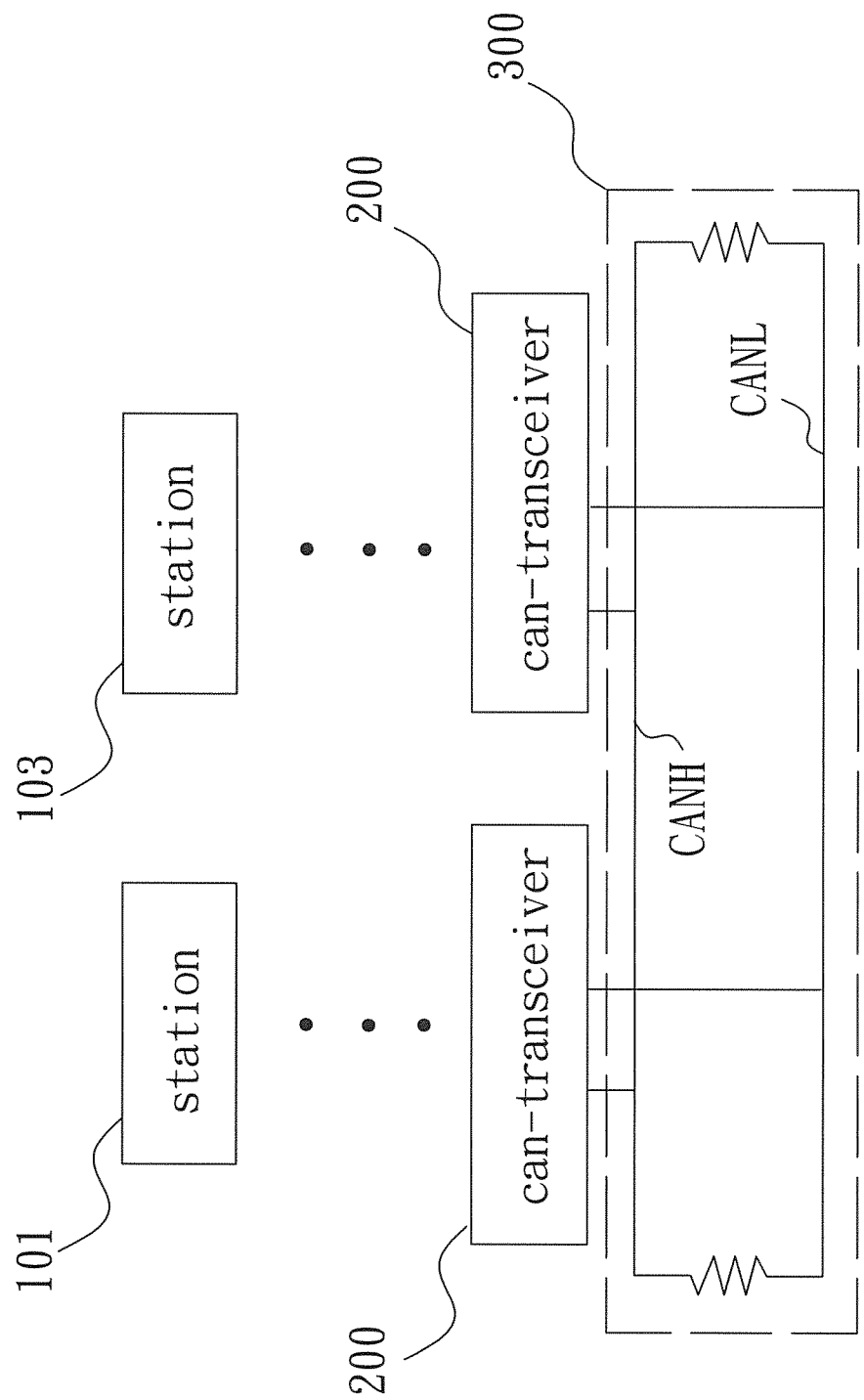
FIG. 1 shows a schematic drawing of a conventional controller area network bus.
Figure 2:
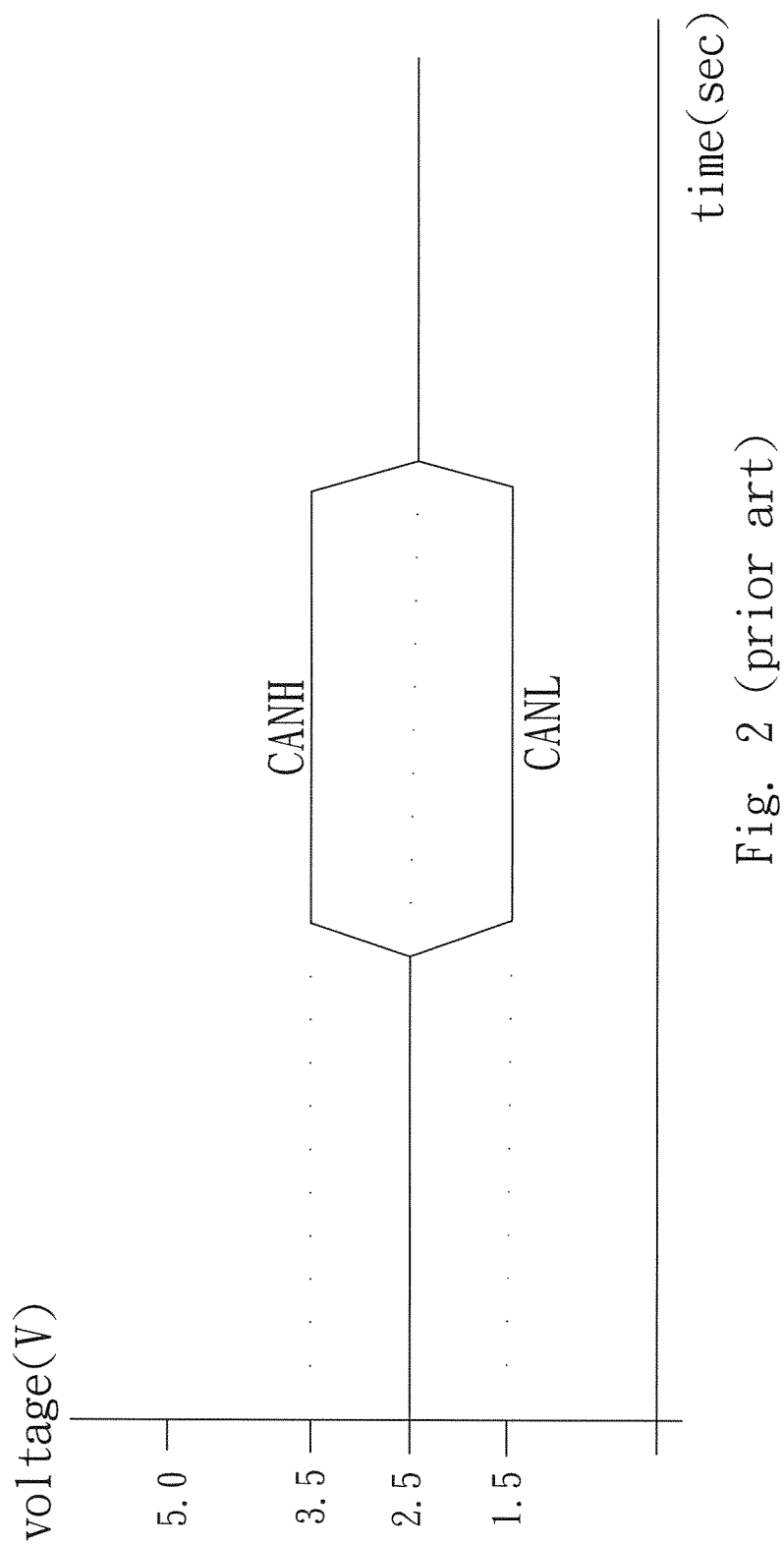
FIG. 2 shows a wave form of a conventional controller area network bus with respect with FIG. 1.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
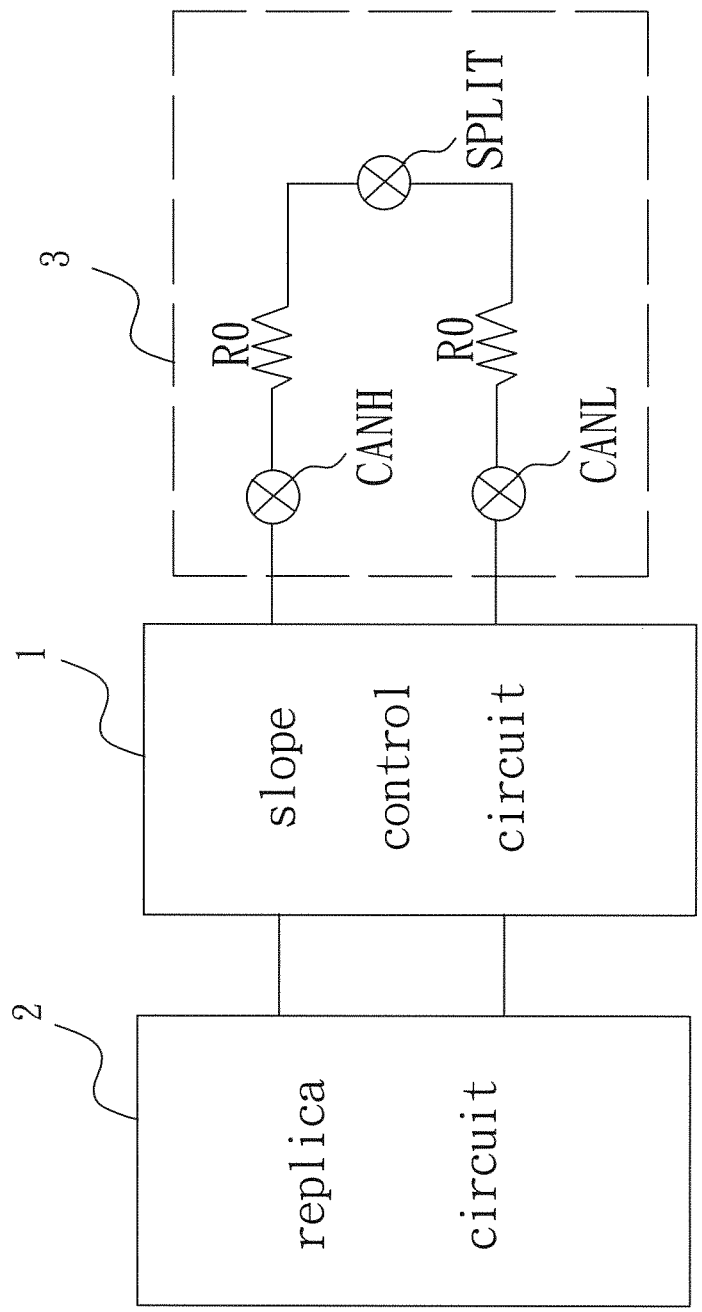
FIG. 3 shows a schematic drawing of a slope control circuit in accordance with one embodiment of the present invention.

Please refer to FIG. 3, which shows a schematic drawing of a slope control circuit in accordance with one embodiment of the present invention. As shown in FIG. 3, the slope control circuit 1 of the present invention is electrically connected between a replica circuit 2 and a controller area network bus (CAN BUS) 3, and the controller area network bus 3 is aimed to transmit a differential signal through a high-level output CANH and a low-level output CANL. Meanwhile, two output resistors R0 are individually connected between the high-level output CANH and a mid-level output SPLIT and between the mid-level output SPLIT and the low-level output CANL. In general, the resistance of the output resistor R0 can be selected to be 60 ohms so that two output resistors R0 in series form a resistance of 120 ohms. However, as required people skilled in the art are allowed to make any modifications regarding the resistance of the output resistor. The present invention is not limited thereto.

Figure 4:
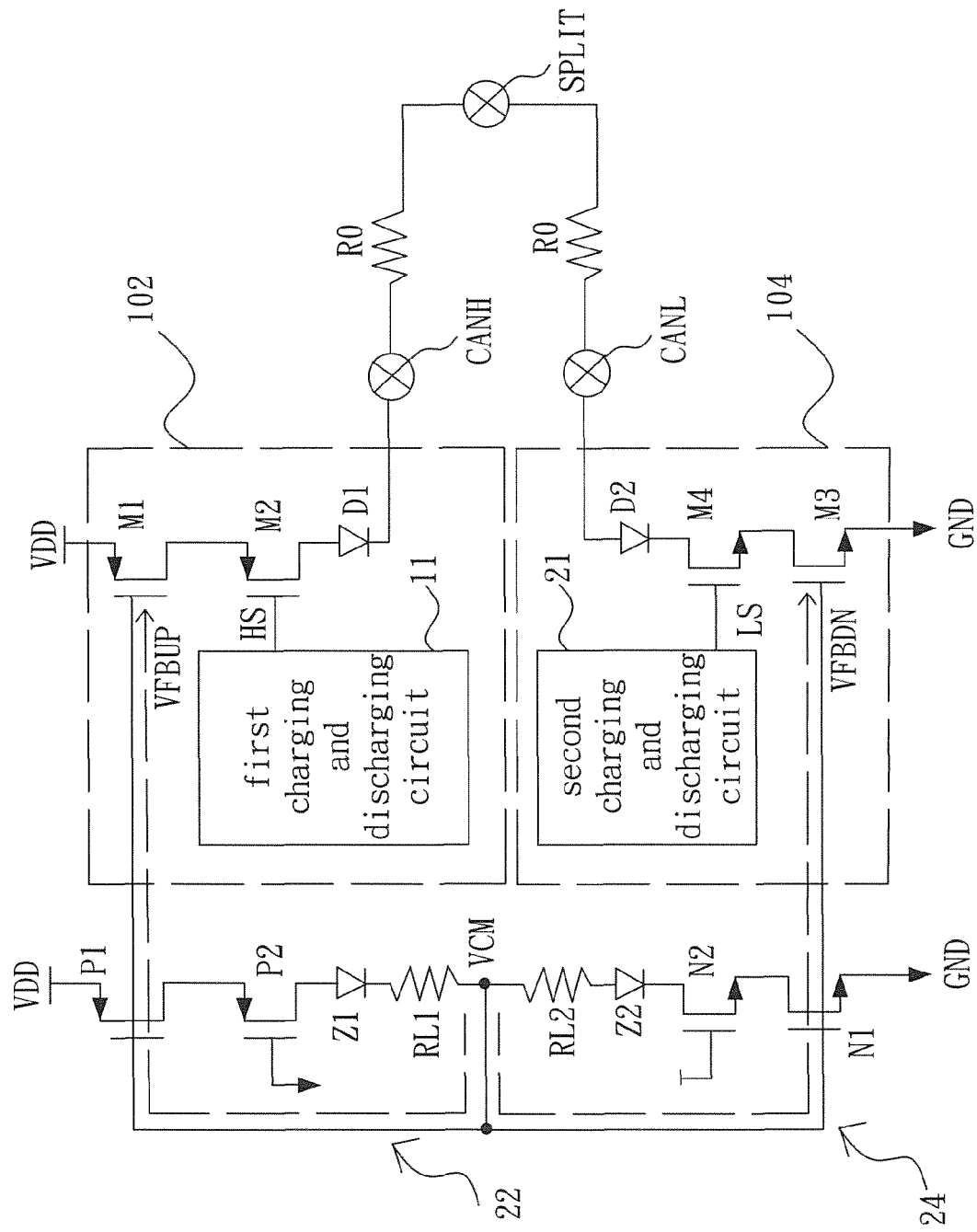
FIG. 4 shows a detailed diagram of a slope control circuit in accordance with one embodiment of the present invention.

FIG. 4 shows a detailed diagram of the slope control circuit in accordance with one embodiment of the present invention. Please refer to FIGS. 3 and 4 at the same time for the following description. As shown, the replica circuit 2 includes both feedback paths, i.e. an upper feedback path 22 and a lower feedback path 24, and the upper feedback path 22 and the lower feedback path 24 are connected jointly to a common mode VCM. According to one embodiment of the present invention, the upper feedback path 22 comprises a PMOS P1, a PMOS P2, a diode Z1 and an upper serial resistor RL1 connected in series. On the other hand, the lower feedback path 24 comprises an NMOS N1, an NMOS N2, a diode Z2 and a lower serial resistor RL2 connected in series. The upper feedback path 22 and the lower feedback path 24 respectively generate an upper feedback signal VFBUP and a lower feedback signal VFBDN from the common mode VCM, and individually transmit the upper feedback signal VFBUP to a first transistor M1 of the slope control circuit 1 and the lower feedback signal VFBDN to a third transistor M3 of the slope control circuit 1 for controlling the DC output levels of the high-level output CANH and the low-level output CANL. However, since these parts of technical characteristics are not the main points of the present invention, they are not specifically discussed below. The present invention simply emphasizes on the slope control circuit 1 that after receiving and being driven by the upper feedback signal VFBUP and the lower feedback signal VFBDN, the slope control circuit 1 of the present invention is able to achieve in controlling the voltage slopes of the high-level output CANH and the low-level output CANL. The detailed descriptions and contents of the present invention are provided as follows.

According to FIG. 4, the slope control circuit 1 of the present invention comprises an upper driving circuit 102 and a lower driving circuit 104. The upper driving circuit 102 is connected between the upper feedback path 22 of the replica circuit 2 and the high-level output CANH and the upper driving circuit 102 comprises the first transistor M1, at least one second transistor M2, a first passive element D1 and at least one first charging and discharging circuit 11. According to the embodiment of the present invention, the first transistor M1, the at least one second transistor M2, and the first passive element D1 are connected in series between an input voltage VDD and the high-level output CANH, and the at least one second transistor M2 is electrically connected to the at least one first charging and discharging circuit 11. It should be notice that a number of the second transistors M2 should be equivalent to that of the first charging and discharging circuits 11. In other words, sometimes for raising the voltage stand of the circuit, designers who choose to dispose a plurality of second transistors M2 which are connected in series are acceptable. Nevertheless, under such circumstances, a plurality of first charging and discharging circuits 11 should also be used for corresponding to the number of second transistors M2. Below, the present invention simply adopts single second transistor M2 and its corresponding one first charging and discharging circuit 11 for explaining the contents and techniques of the present invention. However, people who skilled in the art can figure their own designs based on their different voltage-stand requirements with respect to the present invention without departing from the scope or spirit of the invention. The present invention should not be limited thereto.

Similarly, the lower driving circuit 104 is connected between the lower feedback path 24 of the replica circuit 2 and the low-level output CANL and the lower driving circuit 104 comprises the third transistor M3, at least one fourth transistor M4, a second passive element D2 and at least one second charging and discharging circuit 21. According to the embodiment of the present invention, the third transistor M3, the at least one fourth transistor M4, and the second passive element D2 are connected in series between a ground GND and the low-level output CANL, and the at least one fourth transistor M4 is electrically connected to the at least one second charging and discharging circuit 21. Also, a number of the fourth transistors M4 should be equivalent to that of the second charging and discharging circuits 21. By such arrangements, the present invention is able to control a decreasing voltage slope of the high-level output CANH by charging and discharging the first charging and discharging circuit 11 and an increasing voltage slope of the low-level output CANL by charging and discharging the second charging and discharging circuit 21 such that the decreasing voltage slope of the high-level output CANH is able to be symmetric to the increasing voltage slope of the low-level output CANL for achieving the objective of the present invention.

Figure 5:
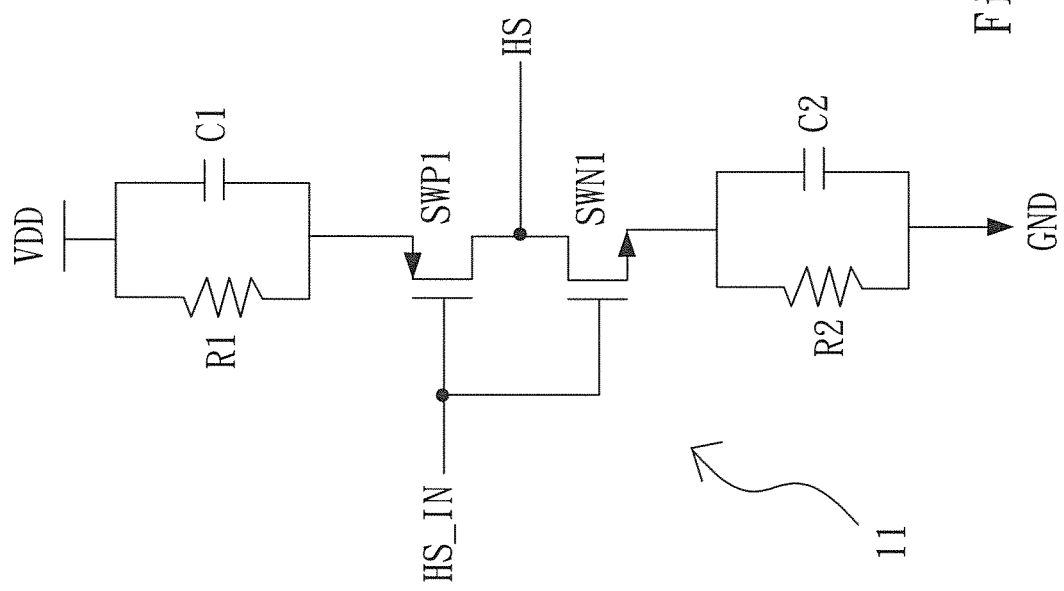
FIG. 5 shows a detailed diagram of a first charging and discharging circuit in accordance with one embodiment of the present invention.
Figure 6:
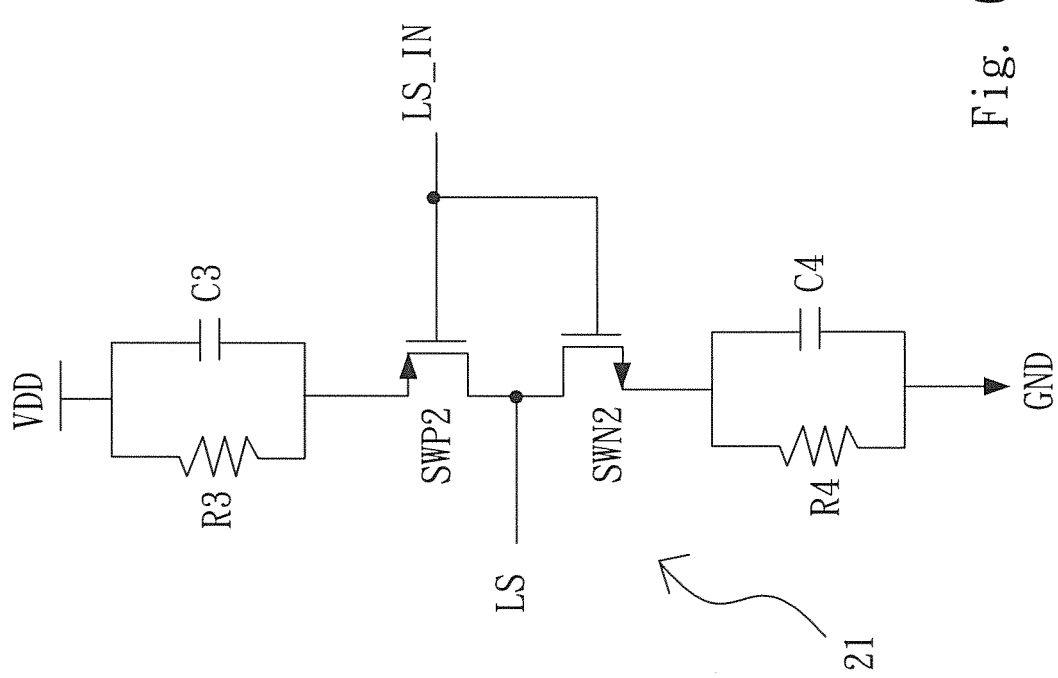
FIG. 6 shows a detailed diagram of a second charging and discharging circuit in accordance with one embodiment of the present invention.

Further, please refer to FIG. 5 and FIG. 6 which respectively show a detailed diagram of the first charging and discharging circuit 11 and the second charging and discharging circuit 21 in accordance with one embodiment of the present invention. As shown in FIG. 5, the first charging and discharging circuit 11 comprises a first resistor R1, a first capacitor C1, a first upper control switch SWP1, a first lower control switch SWN1, a second resistor R2 and a second capacitor C2, wherein the first resistor R1 and the first capacitor C1 are connected in parallel and commonly connected to the input voltage VDD; the first upper control switch SWP1 is connected in series with the first resistor R1 and the first capacitor C1; the first lower control switch SWN1 is connected in series with the first upper control switch SWP1; and the first lower control switch SWN1 and the first upper control switch SWP1 are commonly connected between a first control input source HS_IN and a first output end HS (i.e. the second transistor M2 in FIG. 4). Next, the second resistor R2 is connected between the first lower control switch SWN1 and the ground GND, and the second capacitor C2 is connected to the ground GND and meanwhile in parallel with the second resistor R2.

Similarly, as shown in FIG. 6, the second charging and discharging circuit 21 comprises a third resistor R3, a third capacitor C3, a second upper control switch SWP2, a fourth resistor R4 and a fourth capacitor C4, wherein the third resistor R3 and the third capacitor C3 are connected in parallel and commonly connected to the input voltage VDD; the second upper control switch SWP2 is connected in series with the third resistor R3 and the third capacitor C3; the second lower control switch SWN2 is connected in series with the second upper control switch SWP2; and the second lower control switch SWN2 and the second upper control switch SWP2 are commonly connected between a second control input source LS_IN and a second output end LS (i.e. the fourth transistor M4 in FIG. 4). Next, the fourth resistor R4 is connected between the second lower control switch SWN2 and the ground GND, and the fourth capacitor C4 is connected to the ground GND and meanwhile in parallel with the fourth resistor R4. According to the embodiment shown in FIG. 5 and FIG. 6, it is obvious that the present invention adopts that each of the first transistor M1 and the second transistor M2 of the upper driving circuit 102 is a P metal oxide semiconductor (PMOS); the first passive element D1 is a diode; each of the third transistor M3 and the fourth transistor M4 of the lower driving circuit 104 is an N metal oxide semiconductor (NMOS); the second passive element D2 is a diode; the first upper control switch SWP1 is a PMOS; the first lower control switch SWN1 is an NMOS; a second upper control switch SWP2 is a PMOS; and the second lower control switch SWN2 is an NMOS as an exemplary embodiment of the present invention.

Figure 7:
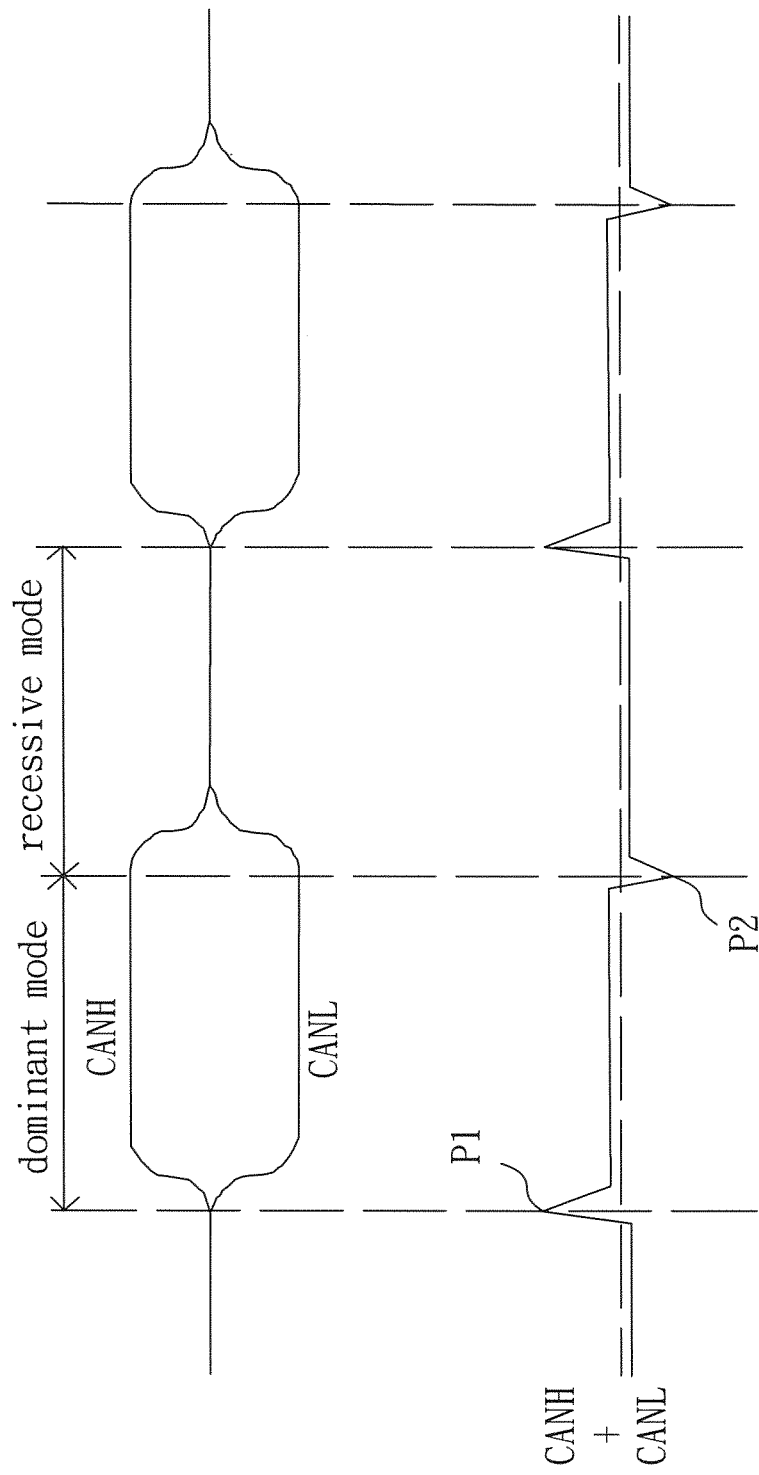
FIG. 7 shows a wave form of the slope control circuit being applied to a controller area network bus in accordance with one embodiment of the present invention.

Therefore, when employing such arrangements and components disposed as previously described, the first output end HS can be controlled to raise to a high voltage level or a low voltage level by dominating the first upper control switch SWP1 and the first lower control switch SWN1 together with an RC-effect caused due to the first resistor R1, the first capacitor C1, the second resistor R2 and the second capacitor C2. In the same methodology, the second output end LS can be also controlled to raise to a high voltage level or a low voltage level by dominating the second upper control switch SWP2 and the second lower control switch SWN2 together with an RC-effect caused due to the third resistor R3, the third capacitor C3, the fourth resistor R4 and the fourth capacitor C4. As a result, controlling the voltage slopes of the first output end HS and the second output end LS helps to turn on and also turn off both their connected second transistor M2 and the fourth transistor M4 simultaneously, thereby dramatically reducing glitch peak values of their output DC voltage signals. FIG. 7 shows a wave form of the slope control circuit being applied to a controller area network bus in accordance with one embodiment of the present invention. As shown in FIG. 7, it is obvious that by employing the proposed slope control circuit of the present invention, the DC glitch peak value P1, P2 of the high-level output CANH and the low-level output CANL can be well controlled under 400 mV. Furthermore, due to contributions from the proposed slope control circuit and the first and second charging and discharging circuits provided in FIGS. 5 and 6, the present invention is able to control both an voltage slope of the high-level output CANH decreasing from ex: 3.5V to a common mode and an voltage slope of the low-level output CANL increasing from ex: 1.5V to a common mode are symmetric when the main circuit switches between a dominant mode and a recessive mode. As a result, based on at least one proof provided above, it is believed that the proposed slope control circuit of the present invention is indeed beneficial to controlling the DC level slope of output voltages and thus can be widely utilized to not only controller area network buses but also other industrial application systems as an extraordinarily performing slope control circuit design.

Figure 8:
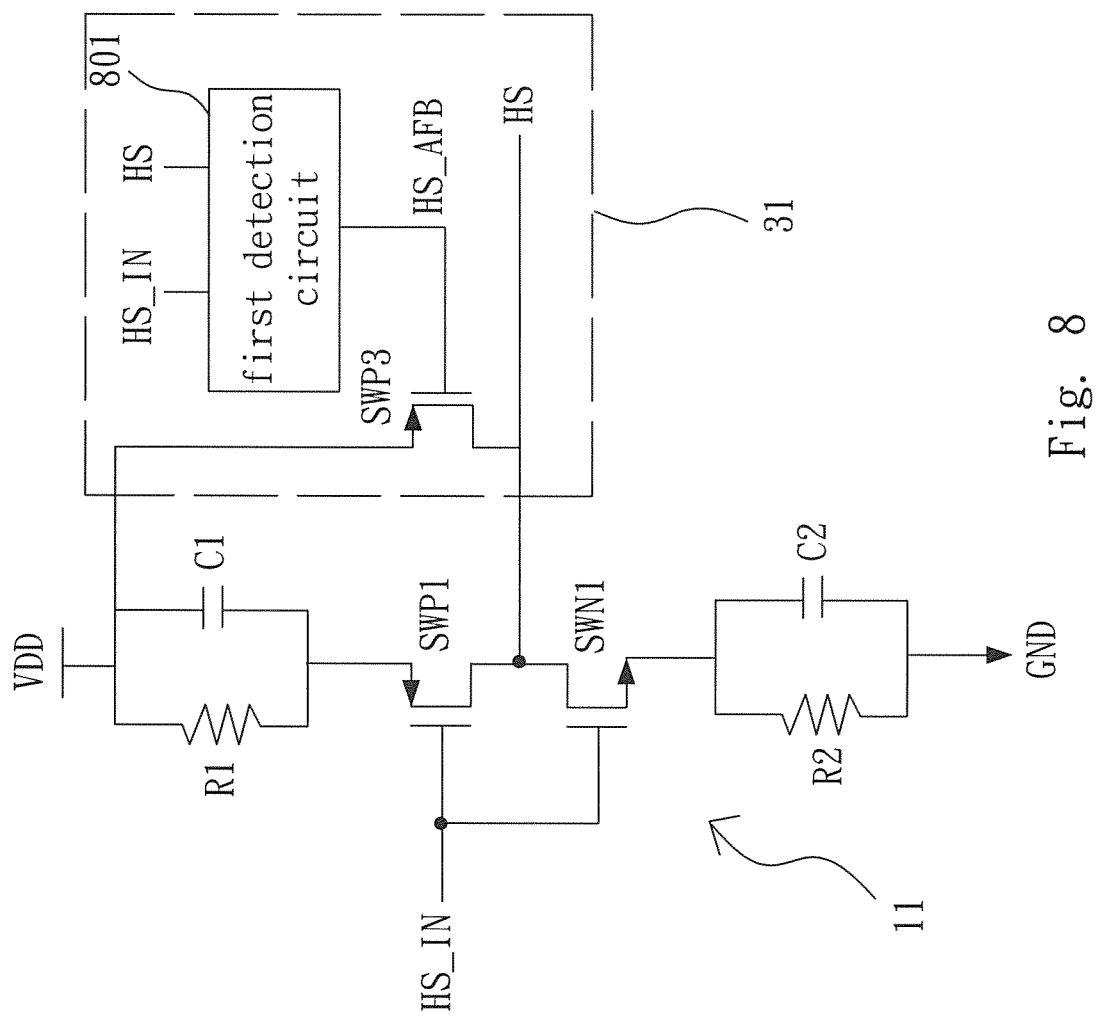
FIGS. 8-10 show a schematic drawing of a first charging and discharging circuit connected to a first self-feedback control circuit in accordance with one embodiment of the present invention, respectively.
Figure 9:
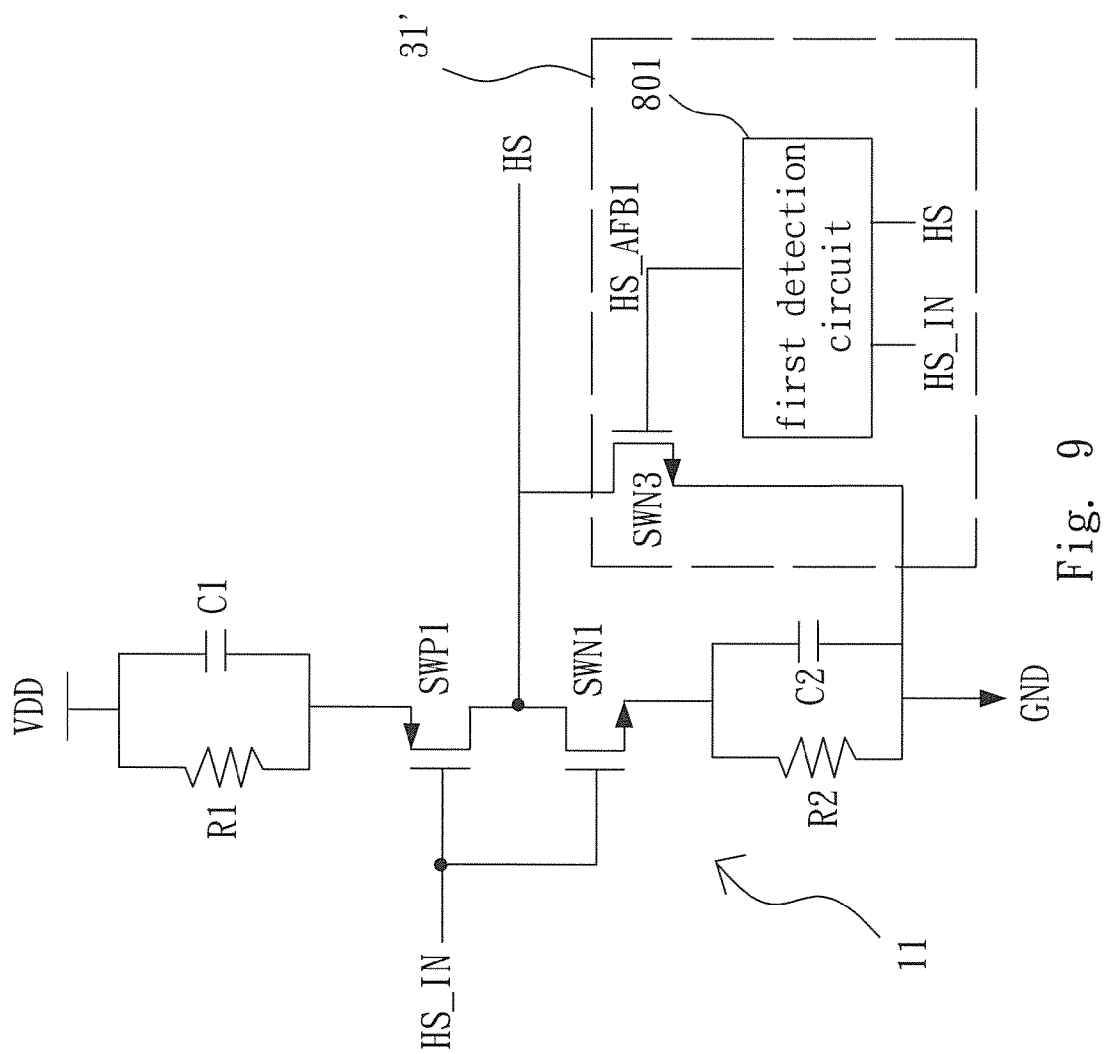

In another aspect, for considering a time delay of the circuit when switching between a dominant mode and a recessive mode, the present invention further discloses a self-feedback control mechanism, which will be shown and explained in the following FIGS. 8-13. Please refer to FIG. 8 first, in which the first charging and discharging circuit 11 can be further connected to at least one first self-feedback control circuit 31. The first self-feedback control circuit 31 comprises a first secondary control switch SWP3 and a first detection circuit 801 connected to the first secondary control switch SWP3, wherein the first detection circuit 801 outputs a first feedback signal HS_AFB and the first feedback signal HS_AFB is transmitted to the first secondary control switch SWP3. In the embodiment as shown in FIG. 8, the first self-feedback control circuit 31 is electrically connected between the first upper control switch SWP1, the first lower control switch SWN1, the first control input source HS_IN, the first output end HS and the input voltage VDD. However, the present invention is not limited thereto. In other words, according to another embodiment of the present invention as shown in FIG. 9, the first self-feedback control circuit 31' can also be optionally electrically connected between the first upper control switch SWP1, the first lower control switch SWN1, the first control input source HS_IN, the first output end HS and the ground GND. In such embodiment as shown in FIG. 9, then the first detection circuit 801 outputs a first feedback signal HS_AFB1 and the first feedback signal HS_AFB1 is transmitted to a first secondary control switch SWN3. What differs from FIG. 8 and FIG. 9 is that, when the first self-feedback control circuit 31 is electrically connected to an upper half of the main circuit (i.e. connect to the input voltage VDD as shown in FIG. 8), then the first secondary control switch SWP3 should be selected from a PMOS and a drain of the first secondary control switch SWP3 should be connected to a joint node where the first upper control switch SWP1 and the first lower control switch SWN1 are connected. As for the first self-feedback control circuit 31' being electrically connected to an lower half of the main circuit (i.e. connect to the ground GND), then the first secondary control switch SWN3 should be selected from an NMOS and a drain of the first secondary control switch SWN3 should be connected to a joint node where the first upper control switch SWP1 and the first lower control switch SWN1 are connected (as shown in FIG. 9).

Figure 11:
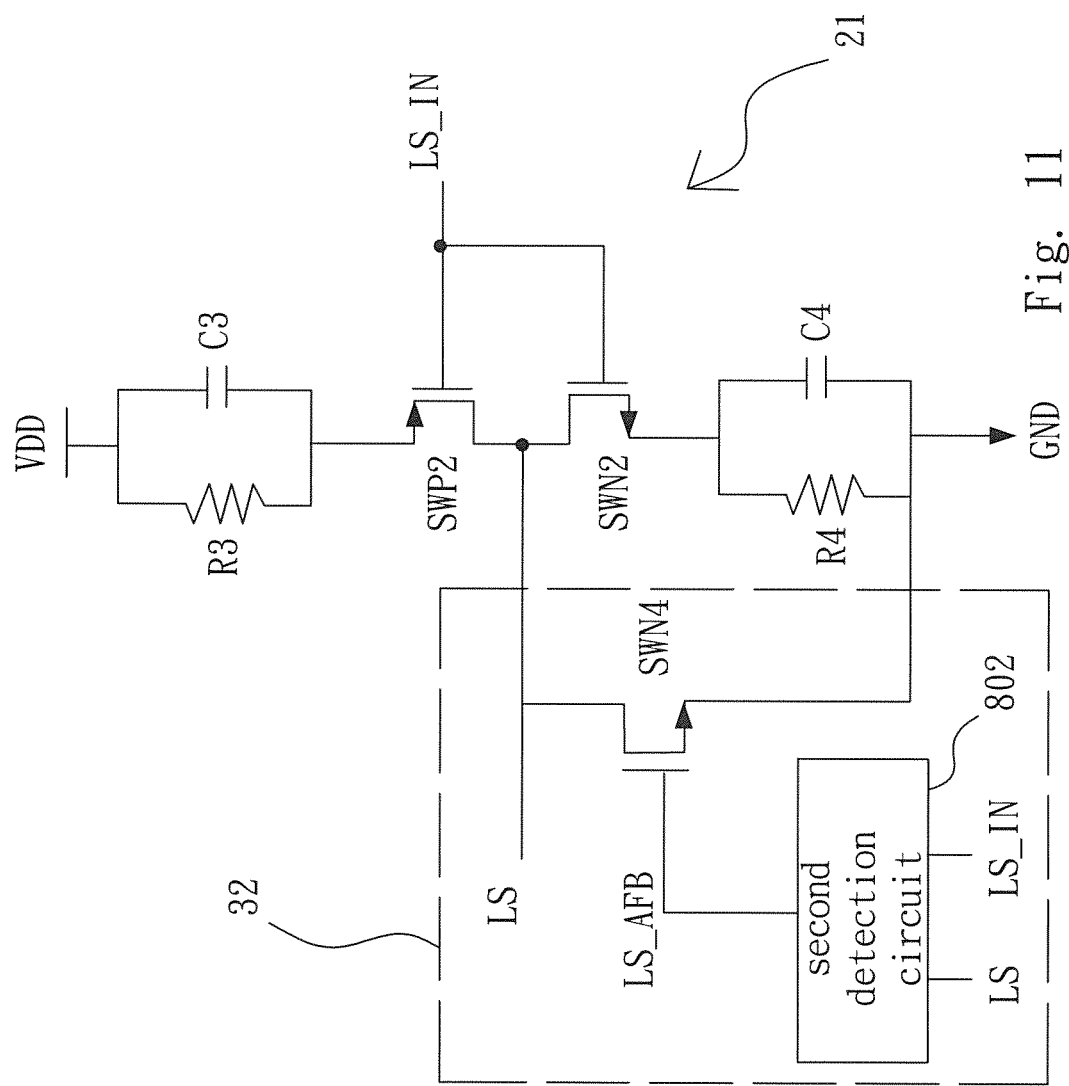
FIGS. 11-13 show a schematic drawing of a second charging and discharging circuit connected to a second self-feedback control circuit in accordance with one embodiment of the present invention, respectively.
Figure 12:
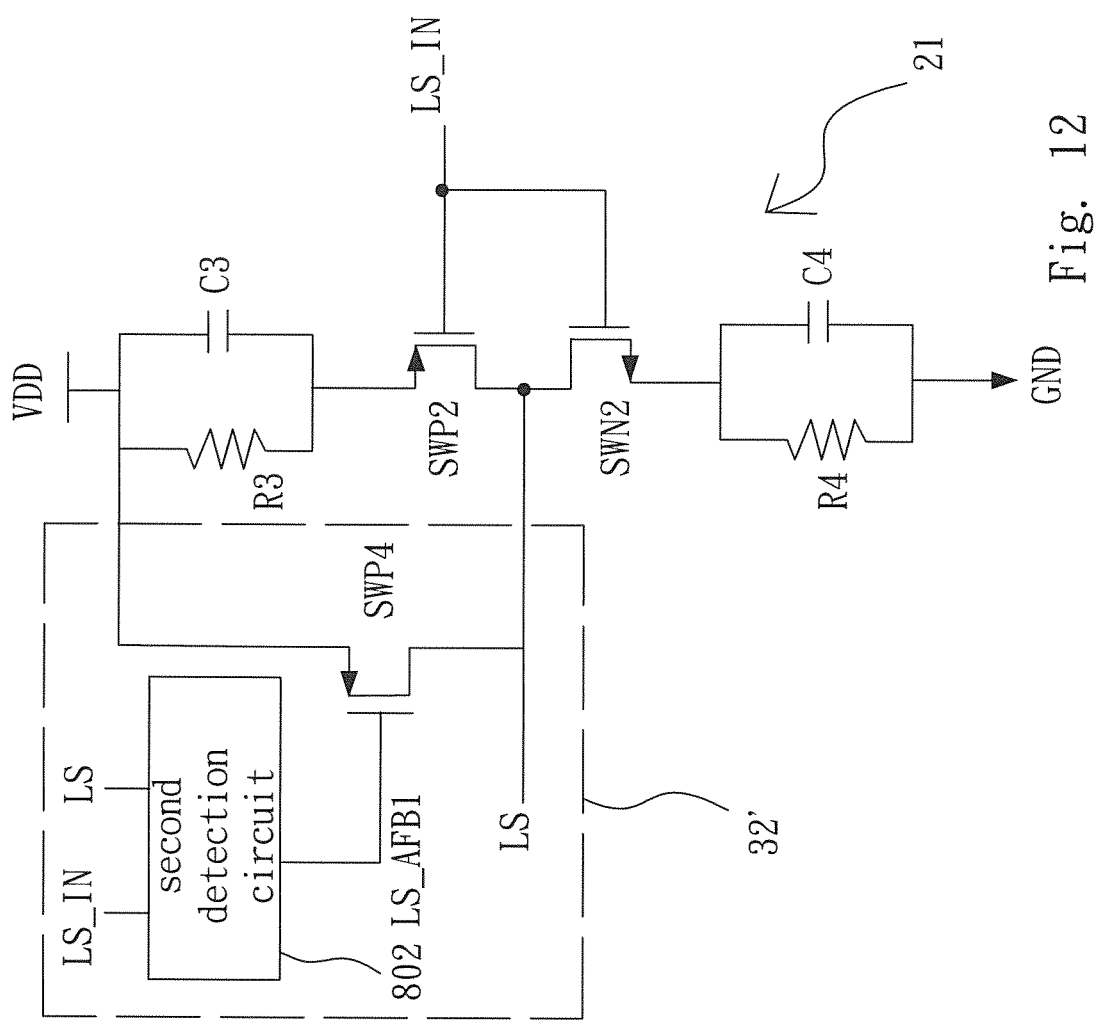

Similarly, for considering a time delay of the circuit when switching between a dominant mode and a recessive mode, FIG. 11 and FIG. 12 show that the second charging and discharging circuit 21 may also be further connected to at least one second self-feedback control circuit 32 or 32'. As shown in FIG. 11, the second self-feedback control circuit 32 comprises a second secondary control switch SWN4 and a second detection circuit 802 connected to the second secondary control switch SWN4. The second detection circuit 802 outputs a second feedback signal LS_AFB and the second feedback signal LS_AFB can be then transmitted to the second secondary control switch SWN4. As for FIG. 12, the second self-feedback control circuit 32' comprises a second secondary control switch SWP4 and a second detection circuit 802 connected to the second secondary control switch SWP4. The second detection circuit 802 outputs a second feedback signal LS_AFB1 and the second feedback signal LS_AFB1 can be then transmitted to the second secondary control switch SWP4. In the embodiment as shown in FIG. 11, the second self-feedback control circuit 32 is electrically connected between the second upper control switch SWP2, the second lower control switch SWN2, the second control input source LS_IN, the second output end LS and the ground GND. At this time, the second secondary control switch SWN4 should be selected from an NMOS, and a drain of the second secondary control switch SWN4 is connected to a joint node where the second upper control switch SWP2 and the second lower control switch SWN2 are connected. On the other hand as shown in FIG. 12, when the second self-feedback control circuit 32' is electrically connected between the second upper control switch SWP2, the second lower control switch SWN2, the second control input source LS_IN, the second output end LS and the input voltage VDD, then the second secondary control switch SWP4 should be selected from a PMOS, and a drain of the second secondary control switch SWP4 is connected to a joint node where the second upper control switch SWP2 and the second lower control switch SWN2 are connected.

Figure 14:
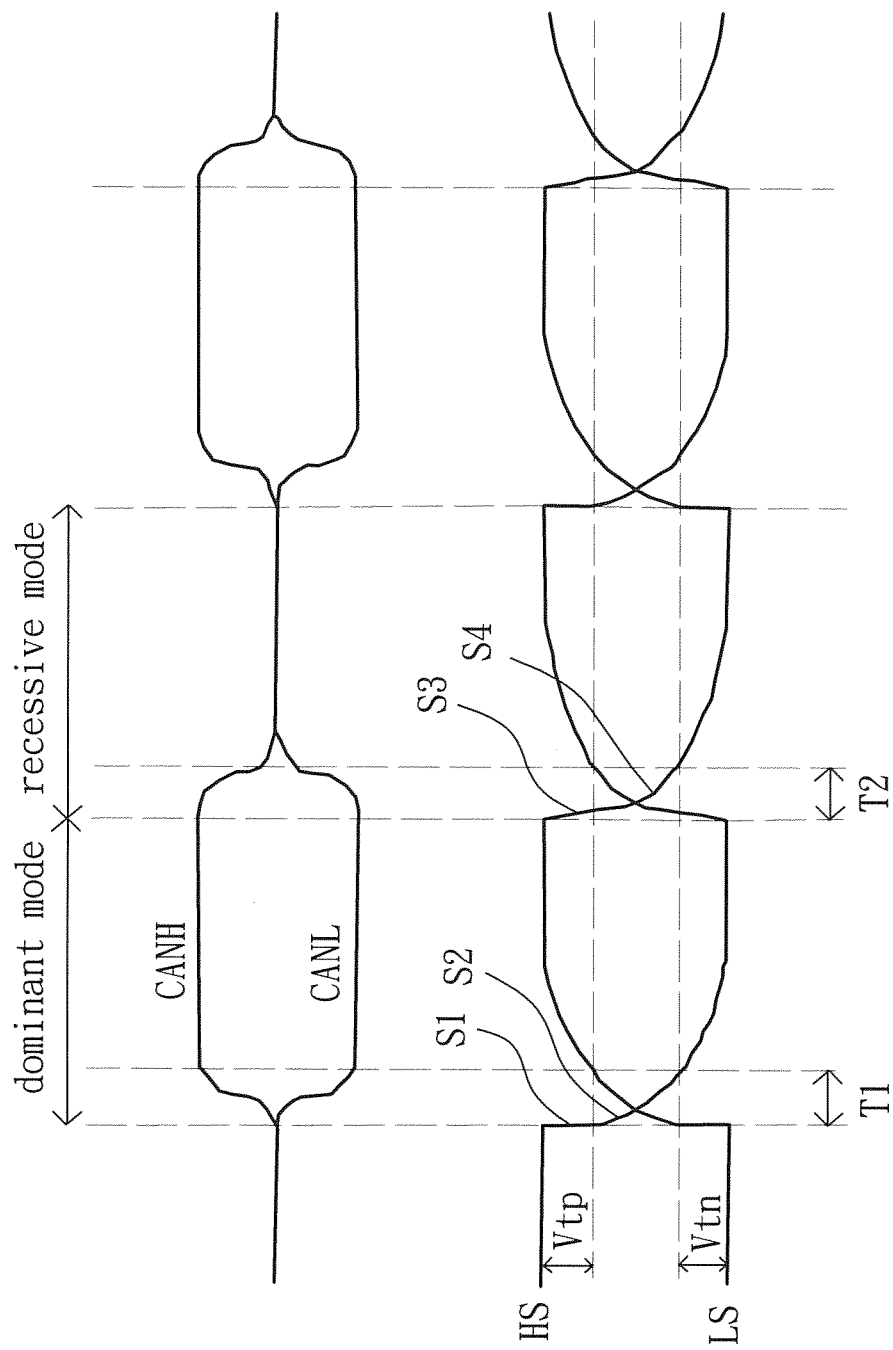
FIG. 14 shows a wave form of the proposed slope control circuit accompanying with the self-feedback control circuit being applied to a controller area network bus in accordance with one embodiment of the present invention.

FIG. 14 shows a wave form of the proposed slope control circuit accompanying with the self-feedback control circuit being applied to a controller area network bus in accordance with one embodiment of the present invention. As shown in FIG. 14, it is apparent that by employing the proposed slope control circuit accompanying with the previously disclosed self-feedback control mechanism, as for the second output end LS when the main circuit switches from a dominant mode to a recessive mode, since the third capacitor C3 contributes to perform charging to a gate of the fourth transistor M4, a gate-to-source voltage of the fourth transistor M4 will rapidly increase to be greater than Vtn, thus turning on the fourth transistor M4 as shown in region S1. Similarly, as for the first output end HS, since the second capacitor C2 also contributes to control discharging of the second transistor M2, a gate-to-source voltage of the second transistor M2 will rapidly increase to be greater than Vtp, thus turning on the second transistor M2. Next, as shown in region 32, due to the RC effects caused due to the first and second charging and discharging circuit 11, 21 the present invention is able to control a decreasing voltage slope of the high-level output CANH as well as an increasing voltage slope of the low-level output CANL, thereby in turn effectively reducing those glitch peak values which may probably be produced in the switching transactions.

In another aspect, when the circuit switches from a recessive mode back to a dominant mode as shown in region S3, the voltage value of the second output end LS can be shortly downed to be less than VDD/2 since the first secondary control switch SWN3 or SWP3 is turned on immediately. Meanwhile, the voltage value of the first output end HS rapidly increases to be over than VDD/2. Later, the first detection circuit 801 and the second detection circuit 802 are used to turn off the first secondary control switch SWN3 and SWP3, and the RC effects caused by the first and second charging and discharging circuit 11, 21 help to control the increasing voltage slope of the high-level output CANH as well as the decreasing voltage slope of the low-level output CANL as shown in region S4. As such, not only the turn-off time of the fourth transistor M4 is well controlled and shortened, but also a delay time T1 when the circuit switches from a dominant mode to a recessive mode will be equal to a delay time T2 when the circuit switches from a recessive mode back to a dominant mode, controlling the delay time T1=T2.

Figure 10:
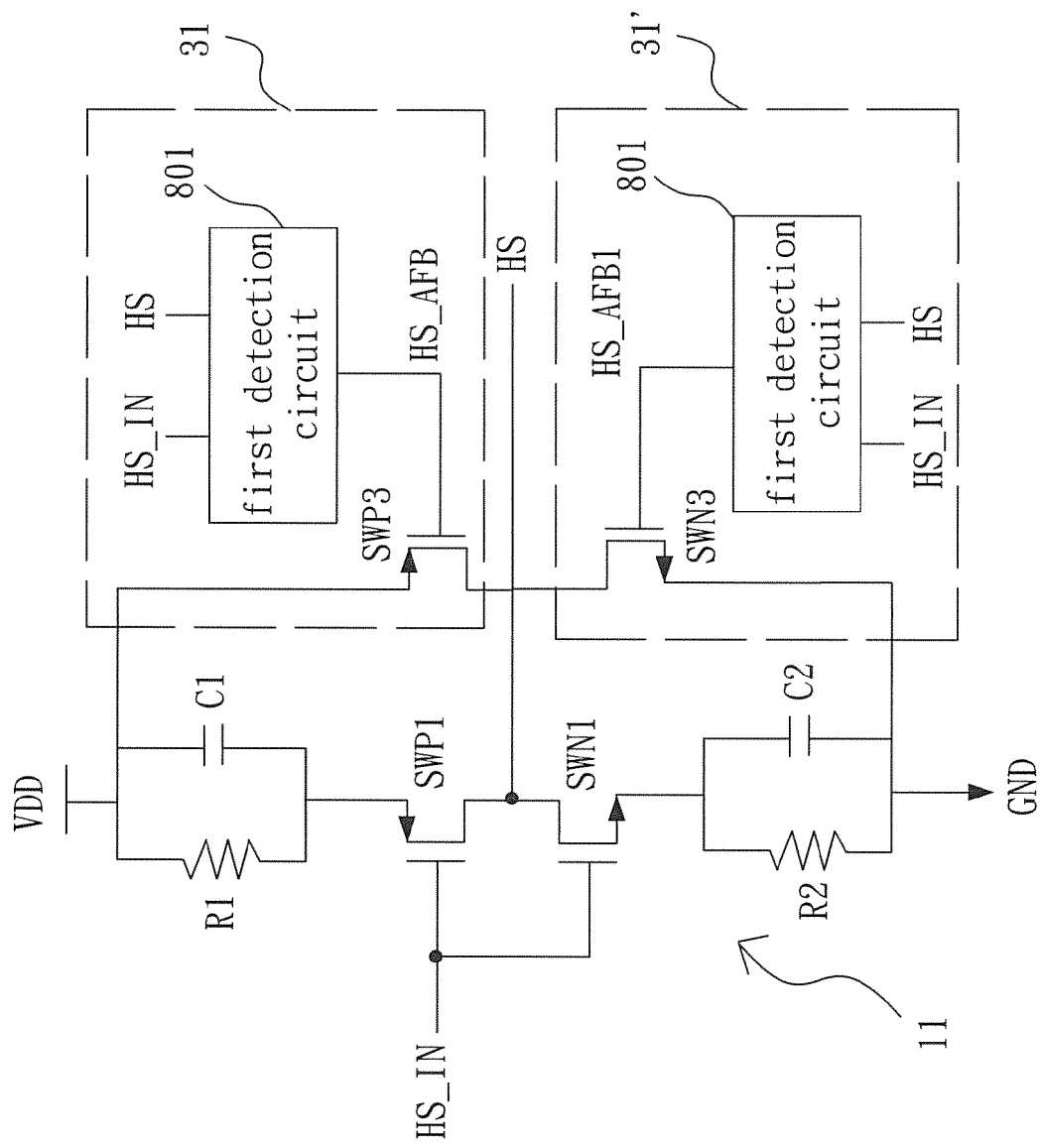
Figure 13:
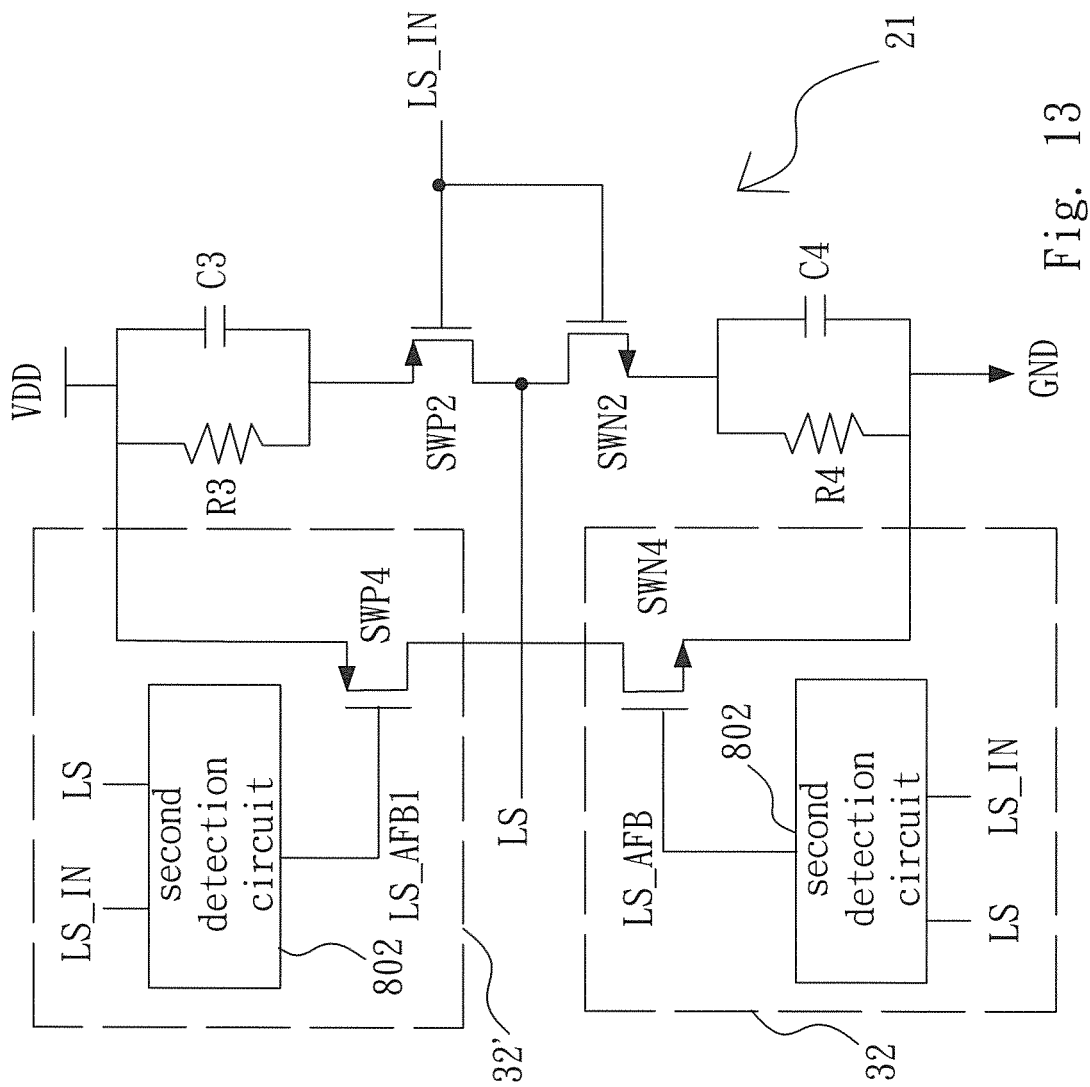
Figure 15:
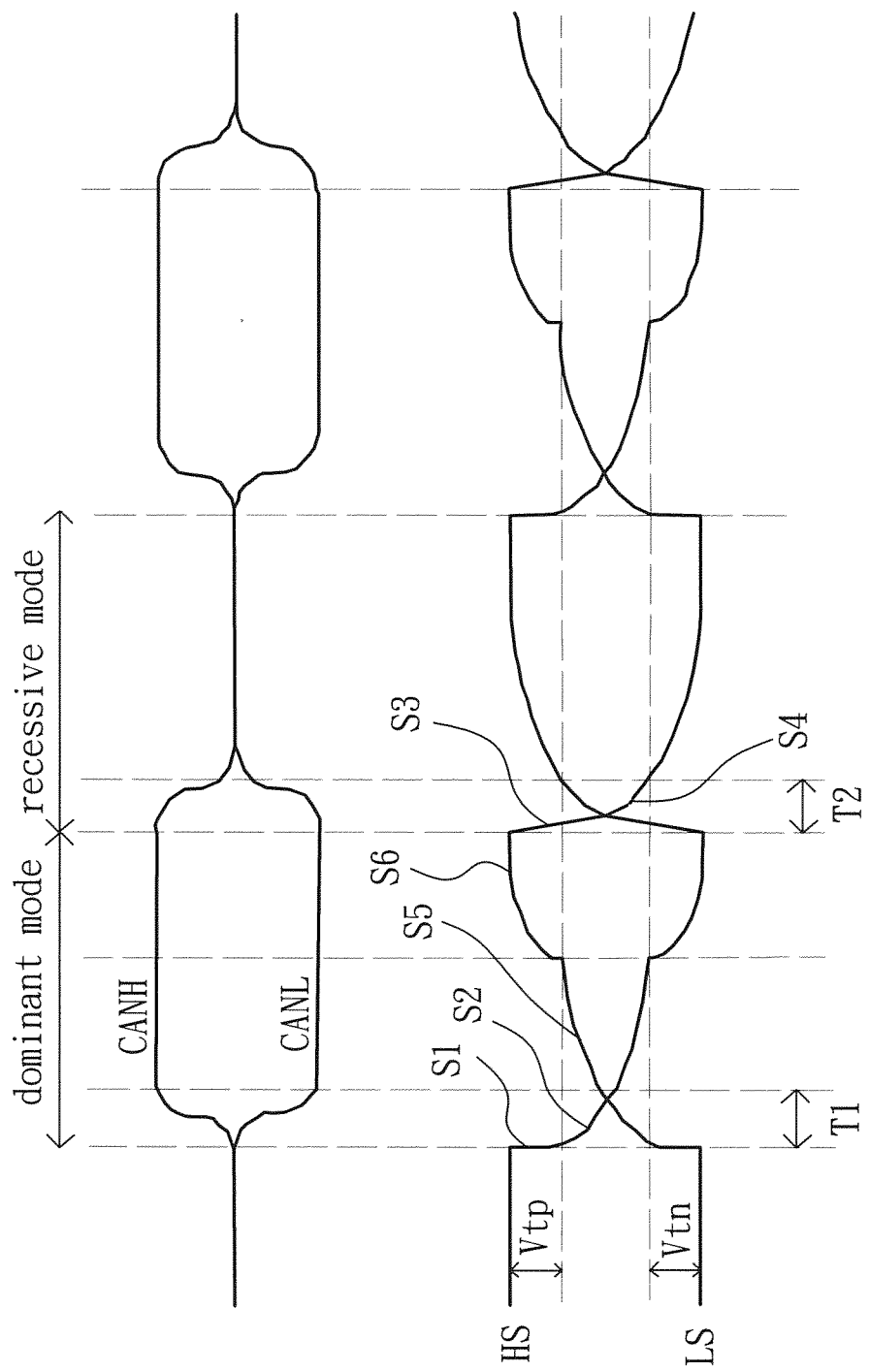
FIG. 15 shows a wave form of the slope control circuit according to FIGS. 10 and 13 being applied to a high-speed controller area network bus in accordance with one embodiment of the present invention.

Furthermore, when considering a transmission speed of a controller area network bus being higher than 5 Mb/s, the present invention further discloses two other embodiments as shown in FIG. 10 and FIG. 13, which can be especially applied to high-speed transmission field. As shown, the first charging and discharging circuit 11 is further electrically connected to both a first self-feedback control circuit 31 and 31', and the second charging and discharging circuit 21 is further electrically connected to both a second self-feedback control circuit 32 and 32'. FIG. 15 shows a wave form of the slope control circuit according to FIGS. 10 and 13 being applied to a high-speed controller area network bus in accordance with one embodiment of the present invention. As shown in FIG. 15, the regions S1-S4 are the same as previously described, so they will not be repeated here-in-after. What's more important is that: since the circuit is operated under a high-speed transmission, its time period within a dominant mode will be shrunk as shown in region S5, thereby affecting the time-delay in the RC effect. As such in region S5, the voltage value of the first output end HS is not able to be downed to "full low", and the voltage value of the second output end LS is not able to be increased to "full high", which may induce the decreasing voltage slope of the high-level output CANH and the increasing voltage slope of the low-level output CANL asymmetric. To address the issue, the first detection circuit 801 and the second detection circuit 802 are then needed to generate the first feedback signal HS_AFB1 and the second feedback signal LS_AFB1 respectively for turning on the first secondary control switch SWN3 and the second secondary control switch SWP4 so as to achieve the waveform as shown in region S6. As a result, then the voltage value of the first output end HS can be successfully downed to "full low", and the voltage value of the second output end LS can be successfully increased to "full high" as shown in region S6, meanwhile controlling the delay time T1=T2 and achieving the objectives of the present invention.

Figure 17:
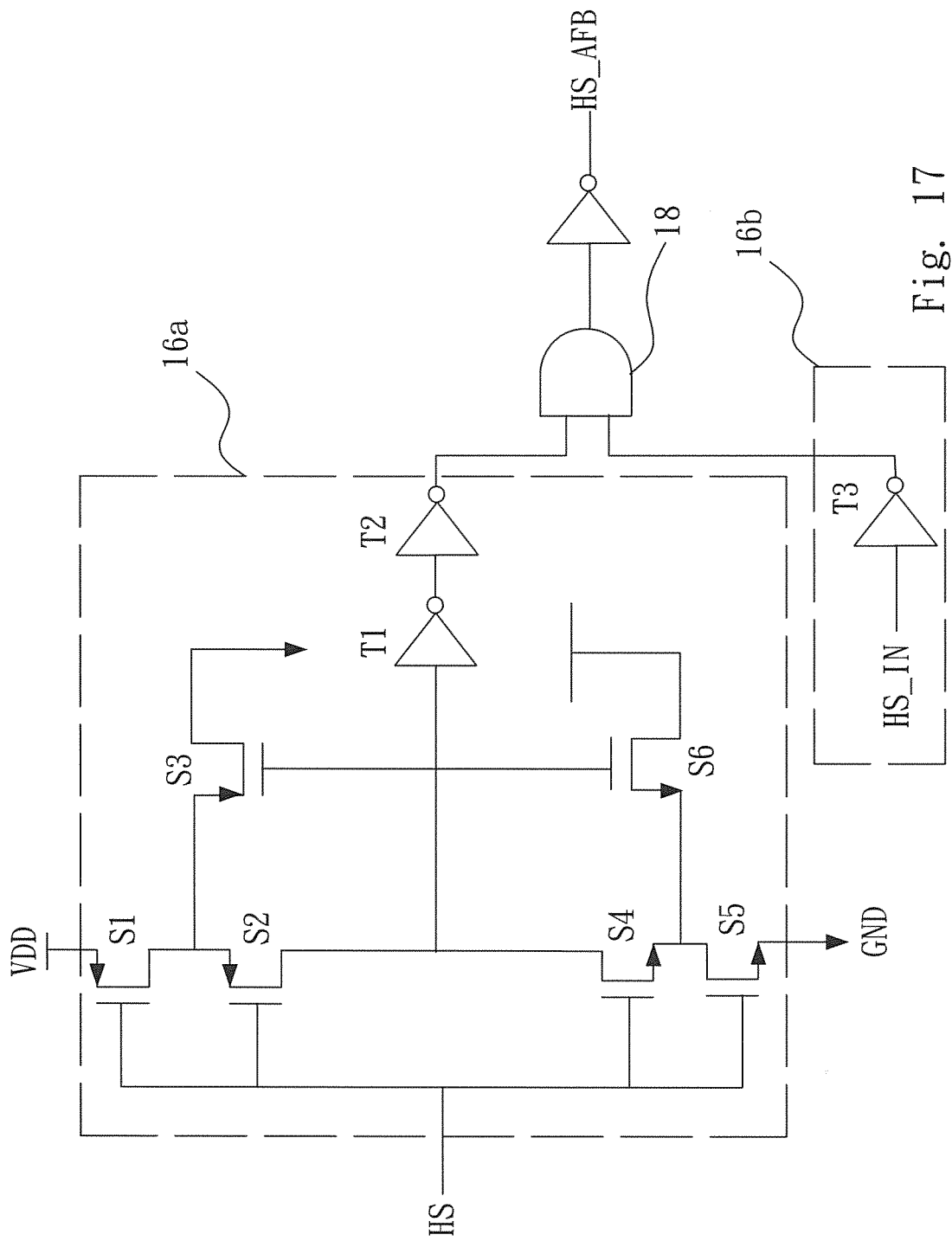
FIG. 17 and FIG. 18 show another two embodiments of the first detection circuit in accordance with one embodiment of the present invention.
Figure 18:
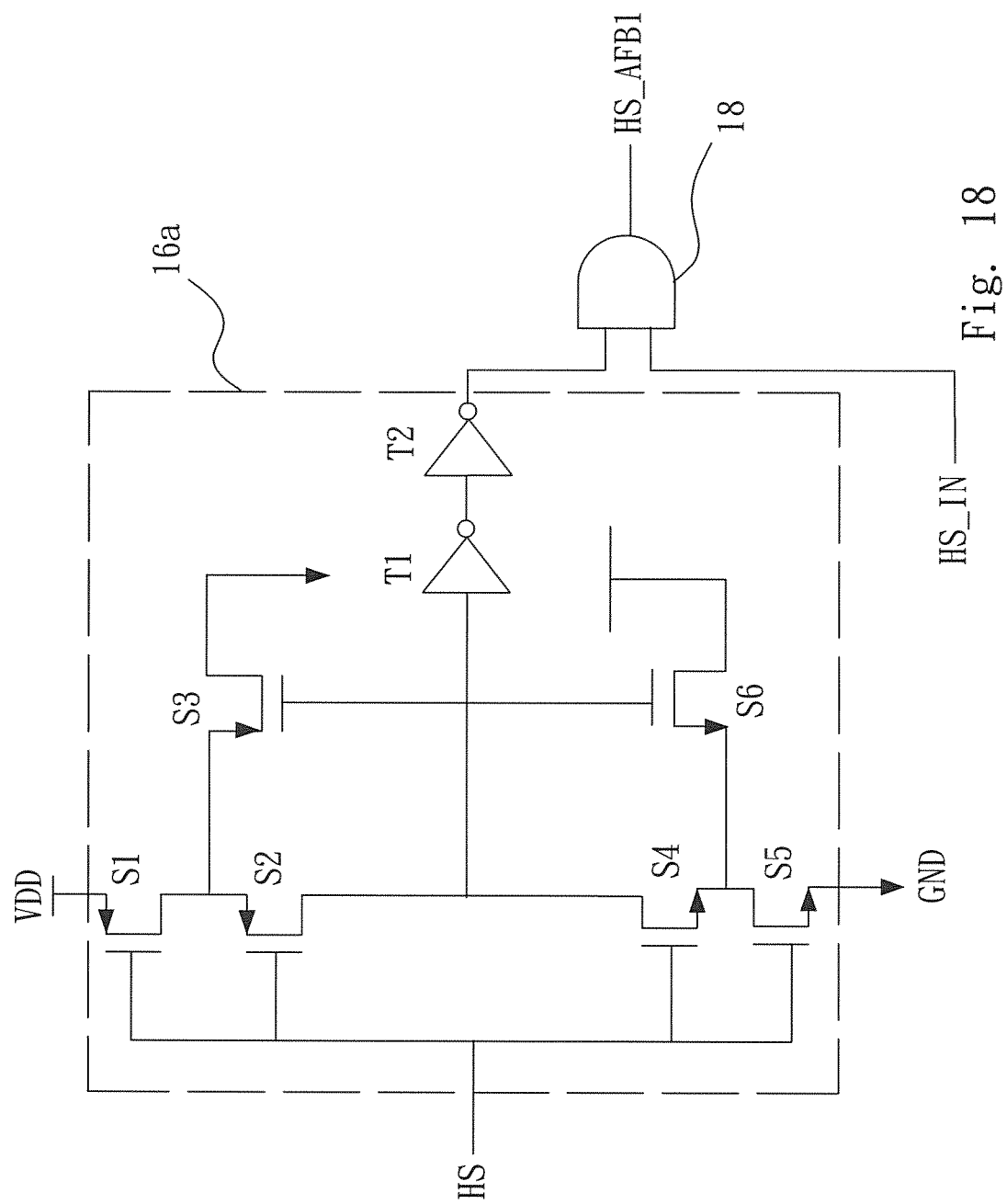

Please refer to FIG. 16A and FIG. 16B, which individually show a detailed drawing of the first detection circuit 801 according to FIG. 8 and FIG. 9. As shown, the first detection circuit 801 comprises at least one detection amplifier 16a, 16b and an AND gate 18 connected in series with the detection amplifiers 16a, 16b, wherein the AND gate 18 outputs the first feedback signal HS_AFB, HS_AFB1 and transmits the first feedback signal HS_AFB, HS_AFB1 to the first secondary control switch SWP3 in FIG. 8 and SWN3 in FIG. 9, respectively. Furthermore, FIG. 17 and FIG. 18 show another two embodiments of the first detection circuit 801. As shown in FIG. 17, the detection amplifier 16a for instance may comprise a plurality of transistors S1-S6 and a plurality of passive elements T1, T2 while the detection amplifier 16b may comprise a passive element T3. However, the detection circuit may also comprise only a single detection amplifier, i.e. the detection amplifier 16a while having no detection amplifier 16b as shown in FIG. 18. In other words, as long as there is at least one detection amplifier being disposed in the detection circuit, then it is sufficient to implement the present invention, still without departing from the scope or spirit of the invention.

Figure 19A:
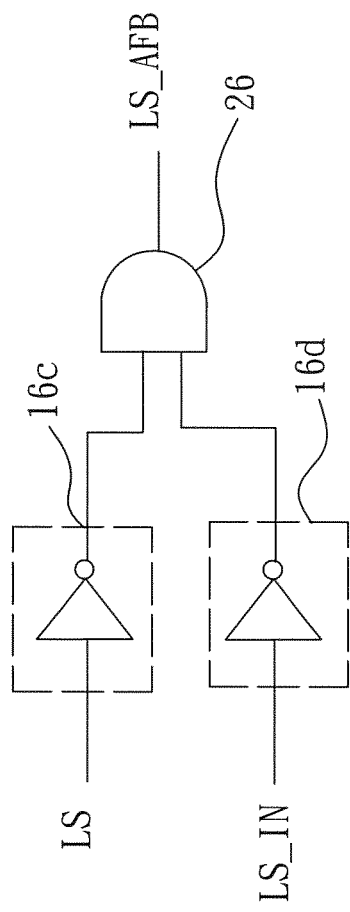
FIG. 19A shows a detailed drawing of the second detection circuit according to FIG. 11.
Figure 19B:
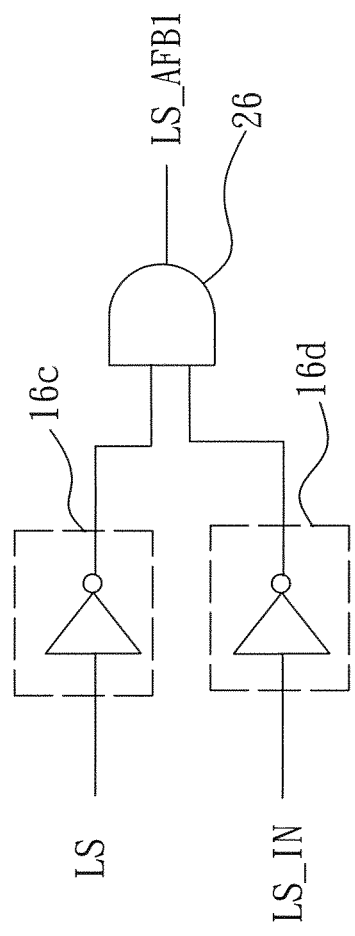
FIG. 19B shows a detailed drawing of the second detection circuit according to FIG. 12.
Figure 20:
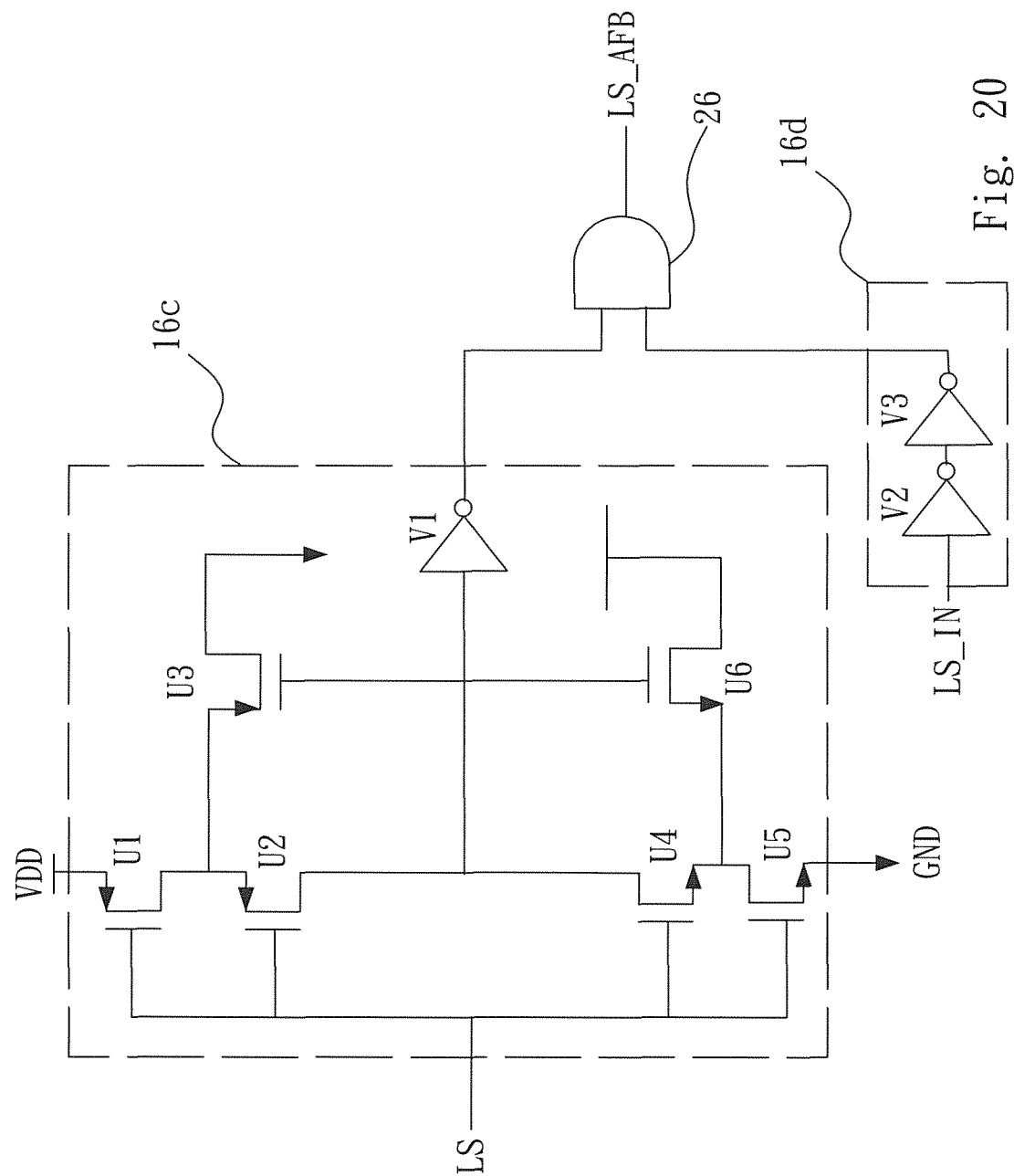
FIG. 20 and FIG. 21 show another two embodiments of the second detection circuit in accordance with one embodiment of the present invention.
Figure 21:
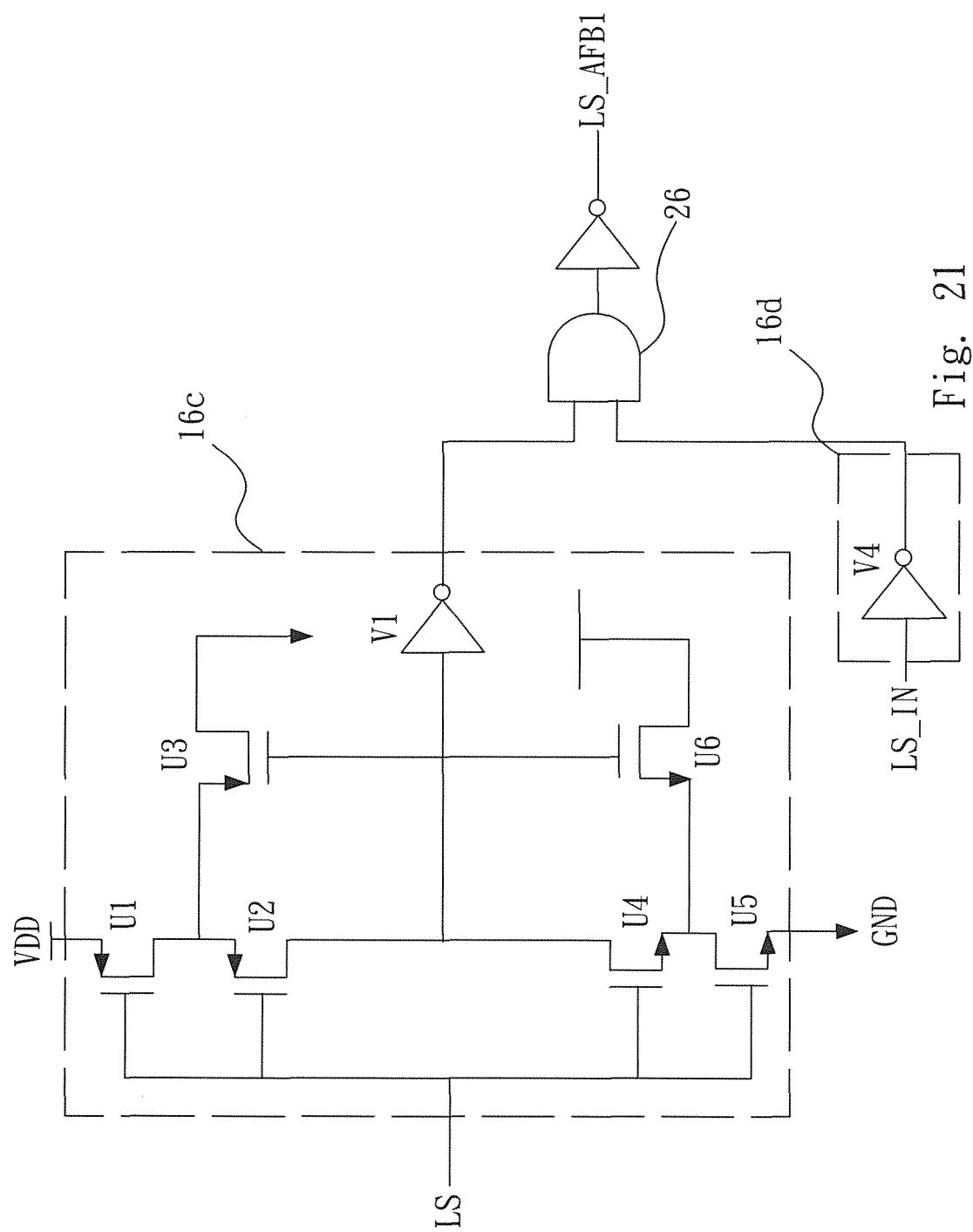

Similarly, please refer to FIG. 19A and FIG. 19B, which individually show a detailed drawing of the second detection circuit 802 according to FIG. 11 and FIG. 12. As shown, the second detection circuit 802 comprises at least one detection amplifier 16c, 16d and an AND gate 26 connected in series with the detection amplifiers 16c, 16d, wherein the AND gate 26 outputs the second feedback signal LS_AFB, LS_AFB1 and transmits the second feedback signal LS_AFB, LS_AFB1 to the second secondary control switch SWN4 in FIG. 11 and SWP4 in FIG. 12, respectively. Furthermore, FIG. 20 and FIG. 21 show another two embodiments of the second detection circuit 802. As shown in FIG. 20, the detection amplifier 16c for instance may comprise a plurality of transistors U1-U6 and passive element V1 while the detection amplifier 16d may comprise a plurality of passive elements V2 and V3. Alternatively, as shown in FIG. 21, then the detection amplifier 16d may also comprise only a single passive element V4. In general, the above mentioned embodiments are only made to be apparent to those skilled in the art that various modifications and variations can be done according to the present invention without departing from the scope or spirit of the invention. In other words, it is believed that the present invention cover modifications and variations of this invention provided, and they shall fall within the scope of the invention and its equivalent as well.

Therefore, to sum up, the present invention indeed discloses a novel slope control circuit never seen before, which can not only process precise control ability to both a decreasing voltage slope and an increasing voltage slope of the output voltage levels of controller area network buses, making both of them symmetric, but also dynamically control its glitch peak within proper specifications (i.e. under 400 mV) when switching between a dominant mode and a recessive mode. Besides, by employing the present invention, it can further control the delay time of the circuit switching from a dominant mode to a recessive mode to be equivalent to that of the circuit switching from the recessive mode back to the dominant mode as well, whereby in accordance with the specification requirements.

Moreover, according to the present invention, it further teaches a self-feedback control circuit and its mechanism for being applied to a high-speed transmission field of controller area network buses while still maintaining excellent circuit performances. As a result, when compared to the prior arts, it is obvious that the present invention apparently shows much more effective performance in both low fabrication cost and low circuit complexity. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A slope control circuit, electrically connected between a replica circuit and a controller area network bus, wherein said replica circuit generates an upper feedback signal and a lower feedback signal, and said slope control circuit receives and is driven by said upper feedback signal and said lower feedback signal so as to control a voltage slope of a high-level output and a low-level output of said controller area network bus, said slope control circuit comprising:
    an upper driving circuit, connected between said replica circuit and said high-level output and comprising at least one first charging and discharging circuit, in which said first charging and discharging circuit is controlled in association with a decreasing voltage slope of said high-level output; and
    a lower driving circuit, connected between said replica circuit and said low-level output and comprising at least one second charging and discharging circuit, in which said second charging and discharging circuit is controlled in association with a increasing voltage slope of said low-level output such that said decreasing voltage slope of said high-level output and said increasing voltage slope of said low-level output are symmetric.

2. The slope control circuit of claim 1, wherein said upper driving circuit further comprises a first transistor, at least one second transistor and a first passive element, said first transistor, said at least one second transistor and said first passive element are connected in series between an input voltage and said high-level output, and said at least one second transistor is electrically connected to said at least one first charging and discharging circuit.

3. The slope control circuit of claim 2, wherein said lower driving circuit further comprises a third transistor, at least one fourth transistor and a second passive element, said third transistor, said at least one fourth transistor and said second passive element are connected in series between a ground and said low-level output, and said at least one fourth transistor is electrically connected to said at least one second charging and discharging circuit.

4. The slope control circuit of claim 3, wherein said first charging and discharging circuit further comprises:
    a first resistor, being connected to said input voltage;
    a first capacitor, being connected to said input voltage and in parallel with said first resistor;
    a first upper control switch, being connected to said first resistor and said first capacitor;
    a first lower control switch, being connected in series with said first upper control switch, and said first lower control switch and said first upper control switch being commonly connected between a first control input source and said second transistor;
    a second resistor, being connected between said first lower control switch and said ground; and
    a second capacitor, being connected to said ground and in parallel with said second resistor.

5. The slope control circuit of claim 4, wherein said second charging and discharging circuit further comprises:
    a third resistor, being connected to said input voltage;
    a third capacitor, being connected to said input voltage and in parallel with said third resistor;
    a second upper control switch, being connected to said third resistor and said third capacitor;
    a second lower control switch, being connected in series with said second upper control switch, and said second lower control switch and said second upper control switch being commonly connected between a second control input source and said fourth transistor;
    a fourth resistor, being connected between said second lower control switch and said ground; and
    a fourth capacitor, being connected to said ground and in parallel with said fourth resistor.

6. The slope control circuit of claim 3, wherein each of said first transistor and said second transistor of said upper driving circuit is a P metal oxide semiconductor (PMOS) and said first passive element is a diode.

7. The slope control circuit of claim 6, wherein each of said third transistor and said fourth transistor of said lower driving circuit is an N metal oxide semiconductor (NMOS) and said second passive element is a diode.

8. The slope control circuit of claim 4, wherein said first upper control switch is a P metal oxide semiconductor (PMOS) and said first lower control switch is an N metal oxide semiconductor (NMOS).

9. The slope control circuit of claim 5, wherein said second upper control switch is a P metal oxide semiconductor (PMOS) and said second lower control switch is an N metal oxide semiconductor (NMOS).

10. The slope control circuit of claim 1, wherein a glitch peak value of said high-level output and said low-level output can be controlled under 400 mV.

11. The slope control circuit of claim 8, wherein said first charging and discharging circuit is further connected to at least one first self-feedback control circuit, said first self-feedback control circuit comprises a first secondary control switch and a first detection circuit connected to said first secondary control switch, said first self-feedback control circuit is electrically connected between said first upper control switch, said first lower control switch, said first control input source and said second transistor, and said first self-feedback control circuit can be optionally connected to said input voltage or to said ground.

12. The slope control circuit of claim 11, wherein when said first self-feedback control circuit is connected to said input voltage, said first secondary control switch is a P metal oxide semiconductor (PMOS) and a drain of said first secondary control switch is connected to a joint node where said first upper control switch and said first lower control switch are connected.

13. The slope control circuit of claim 11, wherein when said first self-feedback control circuit is connected to said ground, said first secondary control switch is an N metal oxide semiconductor (NMOS) and a drain of said first secondary control switch is connected to a joint node where said first upper control switch and said first lower control switch are connected.

14. The slope control circuit of claim 9, wherein said second charging and discharging circuit is further connected to at least one second self-feedback control circuit, said second self-feedback control circuit comprises a second secondary control switch and a second detection circuit connected to said second secondary control switch, said second self-feedback control circuit is electrically connected between said second upper control switch, said second lower control switch, said second control input source and said fourth transistor, and said second self-feedback control circuit can be optionally connected to said input voltage or to said ground.

15. The slope control circuit of claim 14, wherein when said second self-feedback control circuit is connected to said input voltage, said second secondary control switch is a P metal oxide semiconductor (PMOS) and a drain of said second secondary control switch is connected to a joint node where said second upper control switch and said second lower control switch are connected.

16. The slope control circuit of claim 14, wherein when said second self-feedback control circuit is connected to said ground, said second secondary control switch is an N metal oxide semiconductor (NMOS) and a drain of said second secondary control switch is connected to a joint node where said second upper control switch and said second lower control switch are connected.

17. The slope control circuit of claim 11, wherein said first detection circuit further comprises at least one detection amplifier and an AND gate connected in series with said detection amplifier, said AND gate outputs a first feedback signal and transmits said first feedback signal to said first secondary control switch for controlling said first secondary control switch.

18. The slope control circuit of claim 14, wherein said second detection circuit further comprises at least one detection amplifier and an AND gate connected in series with said detection amplifier, said AND gate outputs a second feedback signal and transmits said second feedback signal to said second secondary control switch for controlling said second secondary control switch.

19. The slope control circuit of claim 3, wherein said replica circuit comprises an upper feedback path and a lower feedback path, said upper feedback path and said lower feedback path are connected jointly to a common mode and respectively generate said upper feedback signal and said lower feedback signal for transmitting to said first transistor of said upper driving circuit and said third transistor of said lower driving circuit so as to control a DC output voltage stability of said high-level output and said low-level output.

* * * * *